(12) United States Patent
Hohlfeld et al.

(10) Patent No.: US 8,587,116 B2
(45) Date of Patent: Nov. 19, 2013

(54) SEMICONDUCTOR MODULE COMPRISING AN INSERT (75) Inventors: Olaf Hohlfeld, Warstein (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 86 days.

(21) Appl. No.: 12/894,645

(22) Filed: Sep. 30, 2010

(65) Prior Publication Data
US 2012/0080799 A1  Apr. 5, 2012

(51) Int. Cl.
*H01L 23/34* (2006.01)
*H01L 23/495* (2006.01)
*H01L 23/053* (2006.01)

(52) U.S. Cl.
USPC ....... 257/717; 257/675; 257/700; 257/E23.08

(58) Field of Classification Search
USPC ............ 257/772, 700, 675, 717, 720, E23.08, 257/E23.103
See application file for complete search history.

(56) References Cited

U.S. PATENT DOCUMENTS

| | | | |
|---|---|---|---|
| 6,727,587 B2 | 4/2004 | Riedl | |
| 6,872,465 B2 | 3/2005 | Soga et al. | |
| 7,199,476 B2 | 4/2007 | Hill | |
| 7,276,801 B2 | 10/2007 | Dubin et al. | |
| 7,821,130 B2 | 10/2010 | Hohlfeld et al. | |
| 8,298,867 B2 | 10/2012 | Hohlfeld et al. | |
| 2005/0275096 A1 | 12/2005 | Zeng et al. | |
| 2008/0079021 A1* | 4/2008 | Bayerer et al. | 257/177 |
| 2008/0230905 A1 | 9/2008 | Guth et al. | |
| 2009/0200065 A1 | 8/2009 | Otoshi et al. | |
| 2009/0243089 A1 | 10/2009 | Hohlfeld et al. | |
| 2010/0091463 A1 | 4/2010 | Buresch et al. | |
| 2011/0053319 A1* | 3/2011 | Hohlfeld et al. | 438/121 |

FOREIGN PATENT DOCUMENTS

| | | |
|---|---|---|
| DE | 19647590 A1 | 5/1998 |
| DE | 102004048529 A1 | 5/2005 |
| DE | 102007019885 A1 | 11/2008 |
| DE | 102008002065 A1 | 12/2009 |
| DE | 102009028360 B3 | 12/2010 |
| EP | 0119691 A2 | 9/1984 |
| EP | 0242626 A2 | 3/1987 |

(Continued)

OTHER PUBLICATIONS

Hohlfeld et al., commonly-assigned U.S. Appl. No. 12/850,374, "Method for Fabricating a Circuit Substrate Assembly and a Power Electronics Module Comprising an Anchoring Structure for Producing a Changing Temperature-Stable Solder Bond," filed Aug. 4, 2010.

(Continued)

*Primary Examiner* — Shouxiang Hu
(74) *Attorney, Agent, or Firm* — Murphy, Bilak & Homiller, PLLC (57) ABSTRACT

A power semiconductor module is fabricated by providing a base with a metal surface and an insulating substrate comprising an insulation carrier having a bottom side provided with a bottom metallization layer. An insert exhibiting a wavy structure is provided. The insert is positioned between the insulation carrier and metal surface, after which the metal surface is soldered to the bottom side metallization layer and insert by means of a solder packing all interstices between the metal surface and bottom side metallization layer with the solder.

14 Claims, 11 Drawing Sheets

(56) References Cited

FOREIGN PATENT DOCUMENTS

| | | |
|---|---|---|
| EP | 0330895 A2 | 2/1989 |
| EP | 0764978 A2 | 8/1996 |
| EP | 0790647 A2 | 9/1997 |
| EP | 1873827 A1 | 1/2008 |
| GB | 1389542 | 4/1975 |
| JP | 55093230 A * | 7/1980 |
| JP | 11-343594 | 12/1999 |
| JP | 2004-031771 | 1/2004 |
| JP | 2004-179362 | 6/2004 |

OTHER PUBLICATIONS

Lee et al., "High Temperature Tin-Copper Joints Produced at Low Process Temperature for Stress Reduction," Thin Solid Films, 1996, pp. 213-218, vol. 286.

Xia et al., "Coupling Effects at Cu(Ni)-SnAgCu-Cu(Ni) Sandwitch Solder Joint During Isothermal Aging," Journal of Alloys and Compounds, 2006, pp. 143-149, vol. 417.

* cited by examiner

SEMICONDUCTOR MODULE COMPRISING AN INSERT

FIELD OF THE INVENTION

The invention relates to semiconductor modules, and particularly to semiconductor modules having an insert.

BACKGROUND

Power electronics modules are semiconductor modules used in power electronics circuitry. Power electronics modules are employed typically in vehicular, rail and industrial applications, for example in inverters or rectifiers. They likewise find application in the form of energy generation and transmission. The semiconductor components contained in the power electronics modules may involve e.g. semiconductor chips including an insulated gate bipolar transistor (IGBT), a metal oxide field-effect transistor (MOSFET), a junction field-effect transistor (JFET), a thyristor, or a diode. These semiconductor chips may vary as to their voltage and current handling capacity.

In many semiconductor modules, the semiconductor chips are arranged on a flat, metallized ceramic-based insulating substrate, as the difference between the coefficients of thermal expansion of typical semiconductor materials and ceramics is less than the difference between the coefficients of thermal expansion of typical semiconductor materials and metal. Further advantages of ceramics are the dielectric strength and the good thermal conductivity.

So as to dissipate the waste heat generated by the semiconductor chips, in many modules the insulating substrate is soldered to a metallic base plate. However, the thermomechanical stress caused by thermal cycling of the semiconductor chips causes cracks in particular between the solder and the substrate. Therefore, there is a need for an improved semiconductor module, and for a method for producing an improved semiconductor module.

SUMMARY

According to an embodiment of a semiconductor module, the module includes a rigid base, an insulating substrate, a power semiconductor chip, an insert, and a solder. The insulating substrate comprises an insulation carrier having a top side provided with a top side metallization layer, and a bottom side provided with a bottom side metallization layer. The power semiconductor chip is arranged on the top side metallization layer. The insert, which comprises a wavy shape with a plurality of wave crests and a plurality of wave troughs, is arranged between the base and the bottom side metallization layer such, that the wave crests face toward the bottom side metallization layer and the wave troughs face toward the base. Further, a solder, which completely fills all interstices between the bottom side metallization layer and the base, is arranged between the bottom side metallization layer and the base.

According to an embodiment of a method for producing a semiconductor module, the module is provided with a rigid base, an insulating substrate, a power semiconductor chip, an insert, and a solder. The insulating substrate comprises an insulation carrier having a top side provided with a top side metallization layer, and a bottom side provided with a bottom metallization layer. The power semiconductor chip is arranged on the top side metallization layer. The insert, which comprises a wavy shape with a plurality of wave crests and a plurality of wave troughs, is arranged between the base and the bottom side metallization layer such that the wave crests face toward the bottom side metallization layer and the wave troughs face toward the base. The solder is arranged between the base and the bottom metallization layer. When melting the solder, the insert is embedded in the solder so that the solder completely fills all interstices between the bottom side metallization layer and the base. Then, the solder is cooled down to its solid state.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
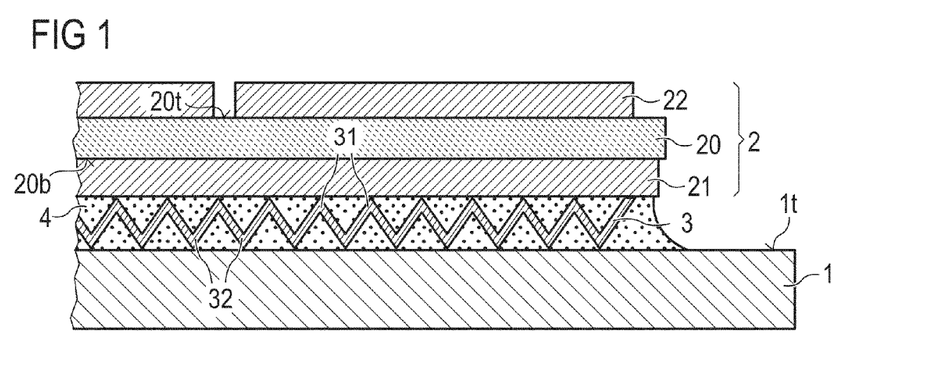
FIG. 1 is a vertical section through a ceramic substrate which is soldered to a base plate by means of a solder layer in which an insert exhibiting the shape of a triangle-wave is embedded.

Referring now to FIG. 1 there is illustrated a vertical section through an assembly comprising an insulating substrate 2 soldered by means of an insert 3 and a solder 4 to the top side 1*t* of a base 1, for instance a plate or a heatsink. For example, the base 1 may be formed of metal, or of a metal-matrix compound material (MMC). Where the base 1 is configured as a heatsink it may feature cooling fins and/or cooling passages for receiving a liquid coolant. Possible cooling methods include fluid cooling, for example with air or a liquid coolant, or evaporation cooling. The base 1 may also be made of a material with good thermal conductivity such as, for example, copper or aluminum or an alloy with at least one of these metals or one such metal comprising such an alloy.

The insulating substrate 2 comprises an insulation carrier 20 configured as a pad topped by a top side metallization layer 22 as its side, designated top side 20*t* and bottomed by a bottom side metallization layer 21 at its opposite side designated bottom side 20*b*. The top side metallization layer 22 is patterned into tracks and/or pads to which one or more electronic components such as e.g. power semiconductor chips can be secured to the insulating substrate 2 and, where applicable, electrically interconnected with one another. The bottom side metallization layer 21 is configured as a non-patterned metallization layer, but which, where applicable, may also be patterned.

The metallization layers 21 and 22 are solidly bonded to the bottom side 20*b* and top side 20*t* respectively of the insulation carrier 20 which may be, for example, a suitable ceramic material such as aluminum nitride (AlN), aluminum oxide (Al2O3), silicon nitride (Si3N4), silicon carbide (SiC) or beryllium oxide (BeO), for instance. The metallizations 21 and 22 are made of copper. The insulating substrate 2 may be, for example, a direct copper bonded (DCB) or a direct aluminum brazed (DAB) or an active metal brazed (AMB) substrate. Optionally, the metallizations 21 and/or 22 and/or the insert 3 may be, independently from one another, further coated with the one or more of the materials silver, NiAu, NiPd, NiPdAu to produce a solderable surface or to facilitate LTJT (low temperature joining technique) joints between a semiconductor chip and the top metallization layer 22.

The contact surface area it of the base 1 may be plated with a further coating of at least one of the materials nickel, silver, gold, palladium or copper and combinations thereof to produce solderable surfaces. These coatings may be created e.g. by electroplating, sputtering or vapour deposition.

The insert 3 exhibits a wavy shape with a number of wave crests 31 and wave troughs 32. The wave crests 31 and wave troughs 32 may be distributed throughout the insert 3.

To solder the insulating substrate 2 and the insert 3 to the base 1 use is made of a solder 4 which during soldering becomes molten to enter and completely fill all interstices that remain between the insulating substrate 2 and the base 1. To minimize the formation of shrinkage cavities, use may be made of a vacuum soldering process. The solder temperature to which the solder 4 is heated during the soldering process may range, for example, from 240° C. to 400° C.

In this arrangement the amount of solder used may be scaled slightly more than the volume needed to fully pack all interstices. This avoids making the spacing between the insert 3 and the top side 1*t* of the base 1 unnecessarily large but still sufficient to compensate the tolerances as to the thicknesses and irregularities of the components being soldered. Using the method as explained with reference to FIGS. 13A to 13D, the solder penetrates the gap between the bottom side of the bottom side metallization layer 21 facing the insert 3 and the top surface of the base 1 facing the insert 3 by a capillary action to become converted into a thin alloy layer in the region of the gap.

The insert 3 serves, among other things, to absorb the thermomechanical stress in the solder 4 by vertical distribution in the solder in thus preventing the solder 4 from becoming detached particularly at the interface between the bottom side of the bottom side metallization layer 21 and the solder by the forces no longer becoming concentrated at the interface in the corner regions of the solder layer as strongly as in a conventional solder bond.

As will be explained in more detail below, the very short distances between the wave crests 31 and the bottom metallization layer 21 and between the wave troughs 32 and the base 1, respectively, facilitate the formation of first areas which continuously extend between the wave crests 31 and the bottom metallization layer 21 and between the wave troughs 32 and the base 1, and which provide for a tight joint between the bottom metallization layer 21, the insert 3 and the base 1.

Figure 2:
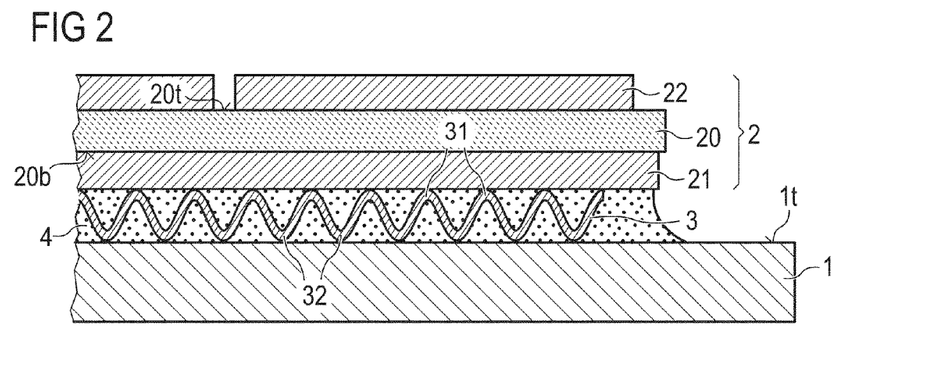
FIG. 2 is a vertical section through a ceramic substrate which is soldered to a base plate by means of a solder layer in which an insert exhibiting the shape of a sine-wave is embedded.
Figure 3:
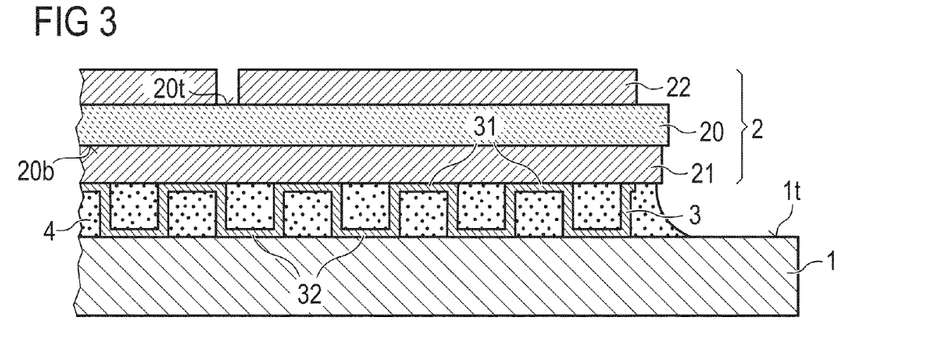
FIG. 3 is a vertical section through a ceramic substrate which is soldered to a base plate by means of a solder layer in which an insert exhibiting the shape of a square-wave is embedded.

FIGS. 2 and 3 show arrangements as explained with reference to FIG. 1, but with the inserts 3 exhibiting different shapes. As shown by way of example in FIG. 2, the wave crests 31 and the wave troughs 32 of the insert 3 may be curved. According to another example shown in FIG. 3, the insert 3 may exhibit square waves.

Figure 4:
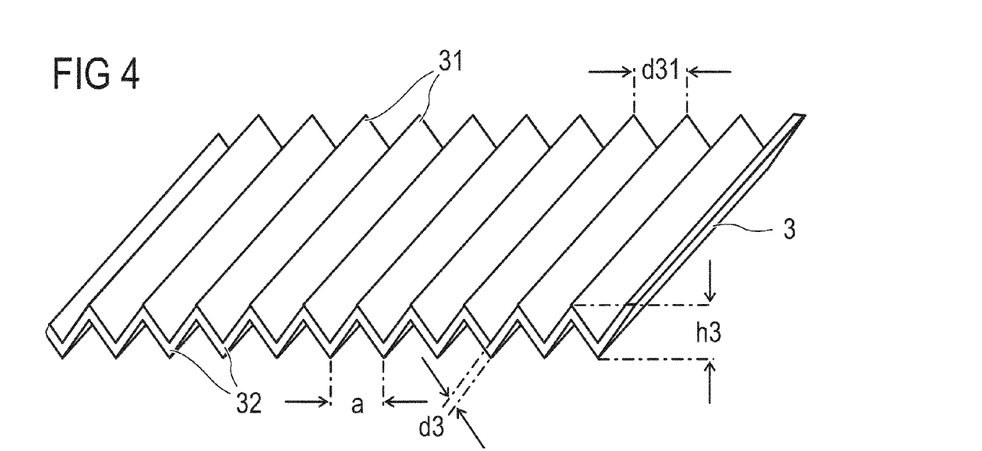
FIG. 4 is a perspective view of an insert exhibiting the shape of a triangle-wave.
Figure 5:
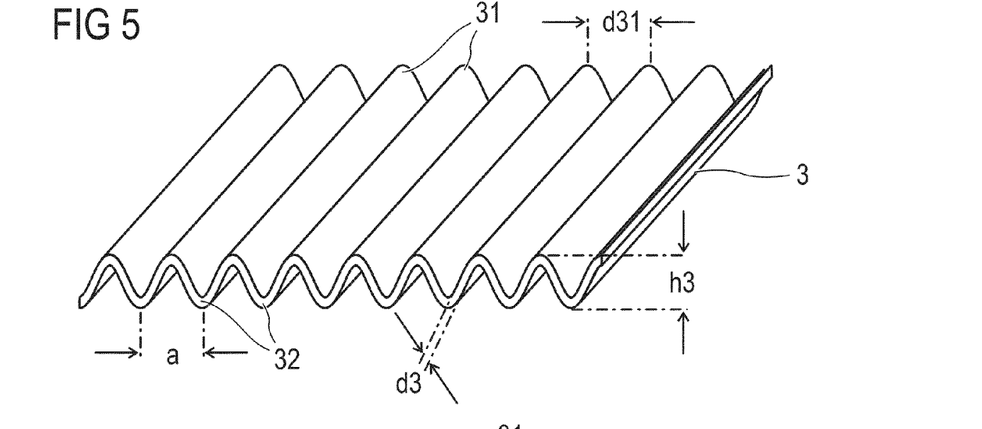
FIG. 5 is a perspective view of an insert exhibiting the shape of a sine-wave.
Figure 6:
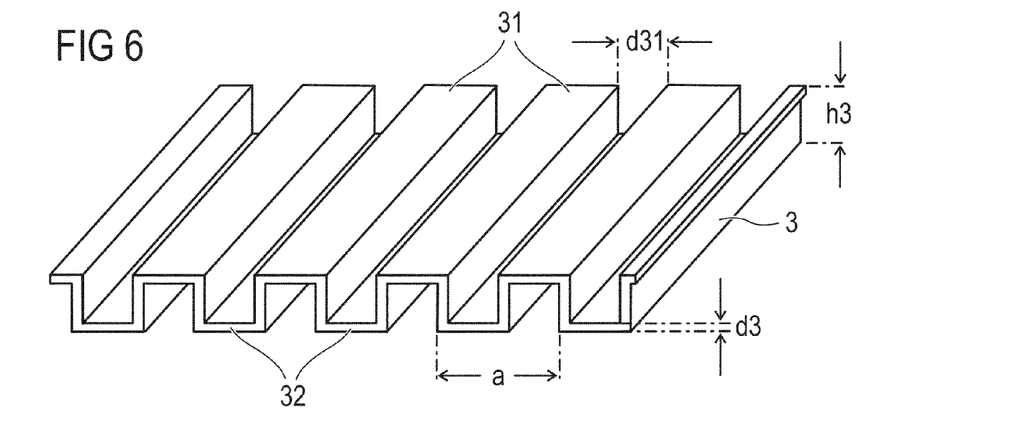
FIG. 6 is a perspective view of an insert exhibiting the shape of a square-wave.

FIGS. 4, 5 and 6 are perspective views of the inserts 3 used in the arrangements of FIGS. 1, 2 and 3, respectively. Even though the shown inserts 3 are unbroken, any insert 3 used in the present invention may be provided with openings so as to facilitate embedding the insert 3 in the solder 4 during the soldering process.

Figure 7:
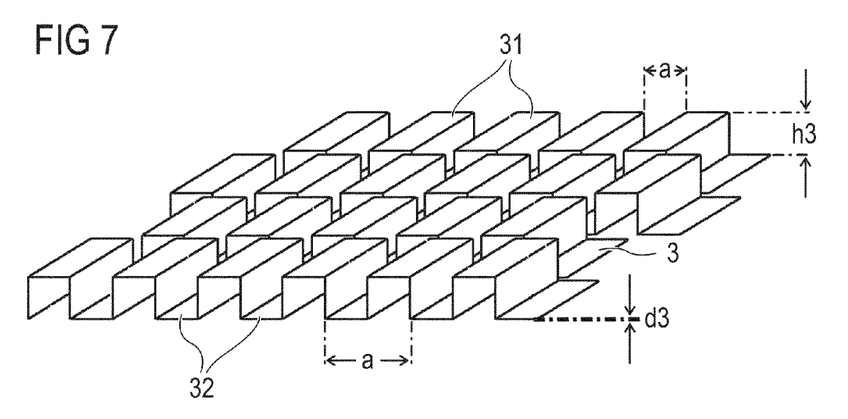
FIG. 7 is a perspective view of an insert exhibiting staggered wave trains with, wherein each wave train has the shape of a square wave.

According to a further example shown in FIG. 7, an insert 3 may exhibit several wave trains. In this example, the wave trains are staggered in the direction of the wave trains. Instead the waves of the shown wave trains are square waves, any other wave form is also possible.

Figure 8A:
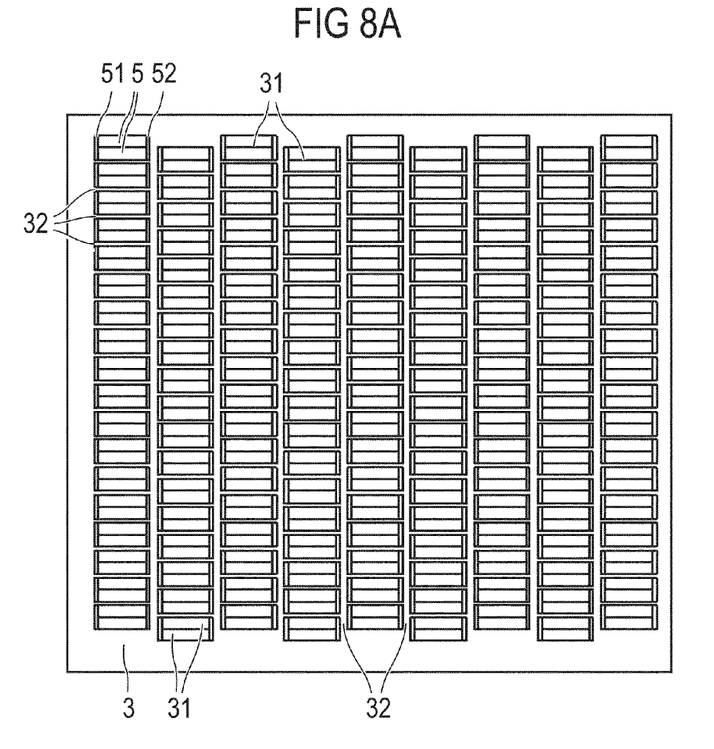
FIG. 8A is a top view of an insert which is produced by stamping and pressing a flat metal sheet.

Still a further example of an insert 3 is shown in FIG. 8A which is a top view. The insert 3 was formed by stamping and pressing and/or embossing a flat metal sheet. In the stamping process, a number of dividing lines 51, 52 running parallel in pairs is generated. Then, in the subsequent pressing and/or embossing process, the sections 5 of the metal sheet which are arranged between the dividing lines 51, 52 of each pair are deformed such that the sections 5 are bent out of the layer of the initially flat metal sheet, thereby forming wave crests 31, wave troughs 32 and openings 33. A side view of this insert 3 is shown in FIG. 8B.

Figure 8B:
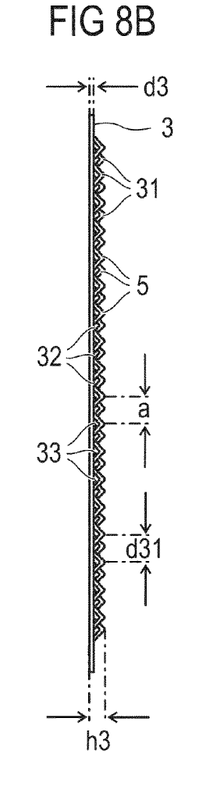
FIG. 8B is a side view of the insert shown in FIG. 8A.

Different from the example shown in FIGS. 8A and 8B, different sections 5 may also be bent to opposite sides of the initially flat metal sheet.

Figure 9A:
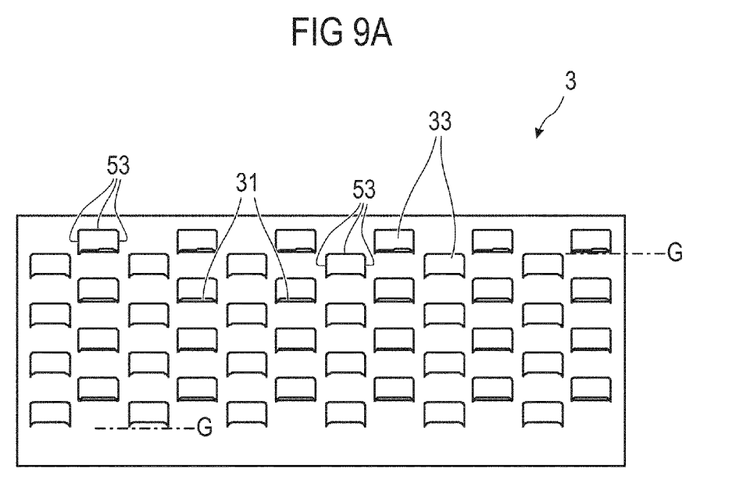
FIG. 9A is a top view of an insert which is produced by stamping a flat metal sheet so as to achieve substantially rectangular lugs, and by bending different lugs to opposite sides of the metal sheet.
Figure 9B:
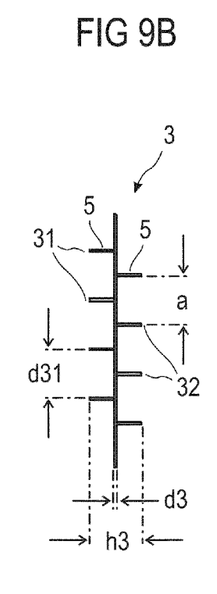
FIG. 9B is a side view of the insert shown in FIG. 9A.
Figure 10A:
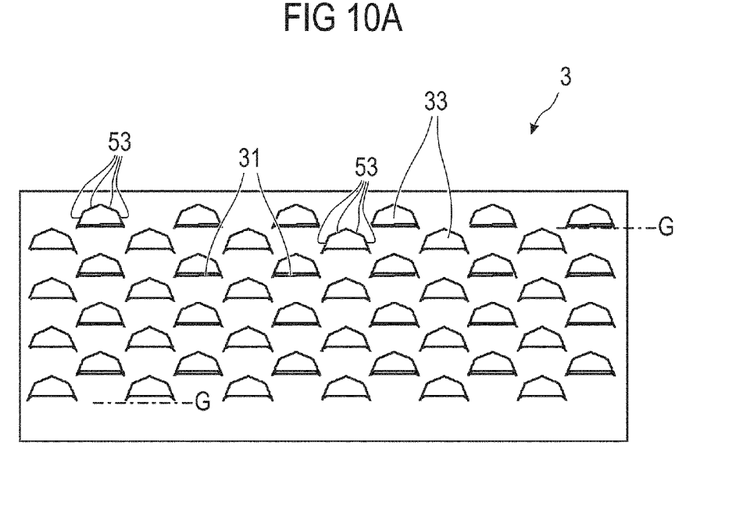
FIG. 10A is a top view of an insert which is produced by stamping a flat metal sheet so as to achieve polyangular lugs, and by bending different lugs to opposite sides of the metal sheet.
Figure 10B:
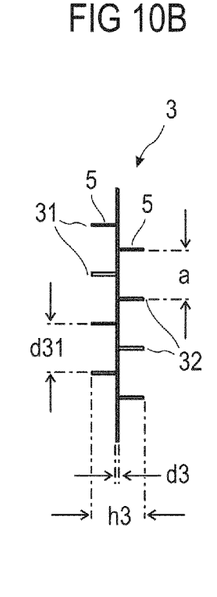
FIG. 10B is a side view of the insert shown in FIG. 10A.

Further inserts as for example shown in FIGS. 9A and 10A and the corresponding side views in FIGS. 9B and 10B, respectively, may also be produced by stamping and bending an initially flat metal sheet. To this end, the flat metal sheet is stamped, thereby producing nonlinear dividing lines 53. Each of these dividing lines 53 defines a section 5 of the metal sheet. In a subsequent step, the sections 5 are bent so as to protrude from the layer of the initially flat metal sheet. The bending of a section 5 may be effected along a line G through both ends of the corresponding dividing line 53. As can be seen in particular from FIGS. 9B and 10B, different sections 5 may be bent to opposite sides of the initially flat metal sheet. The bending angles may be, as also shown in FIGS. 9B and 10B, 90°. However, bending angles in the range from more than 0° and less than 90° may also be applicable. In this case, the sections 5 act as springs contacting the bottom side metallization layer 21 or the base 1 when the insert 3 is arranged between the base 1 and the substrate 2 and when the base 1 and the substrate 2 are pressed against one another during the soldering process.

In any case in which the insert 3 is formed of a foil, the thickness d3 of the foil may be, for instance, in the range from 20 μm to 200 μm, or in the range from 20 μm to 100 μm.

Figure 11A:
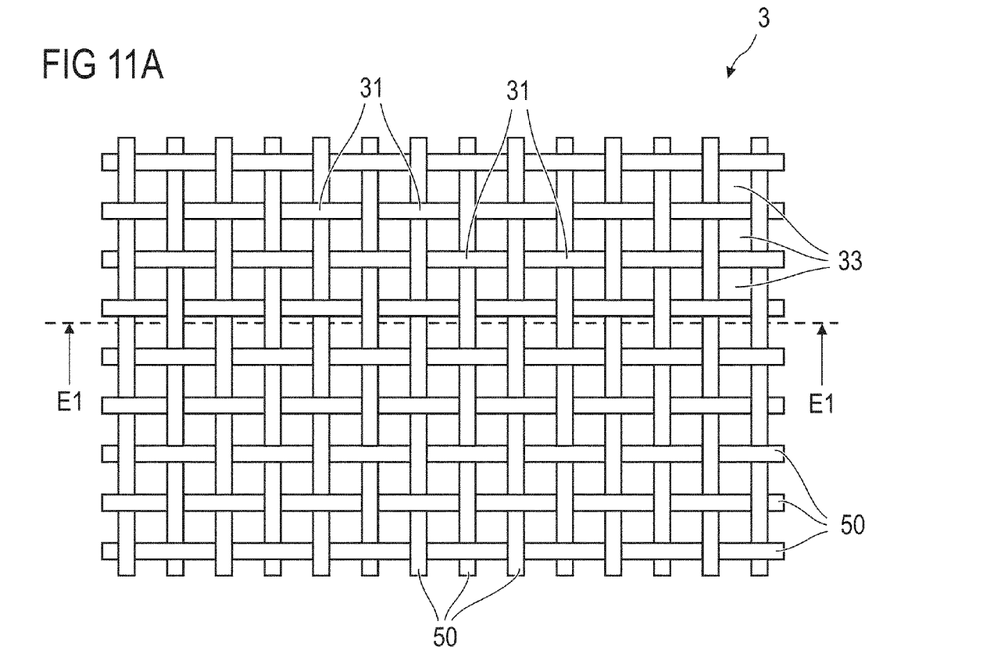
FIG. 11A is a top view of an insert which is formed as a fabric of woven wires.
Figure 11B:
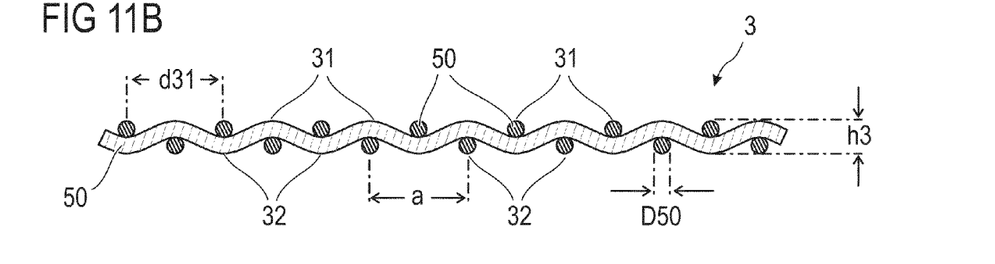
FIG. 11B is a vertical section of the insert shown in FIG. 11A in a sectional plane E1.

Further examples for possible shapes of an insert 3 are shown in FIGS. 11A to 13. FIG. 11A shows an insert 3 which is designed as a fabric of woven wires 50. A cross sectional view of the insert 3 in a sectional plane E1 is shown in FIG. 11B. As can be seen, the wires 50 may exhibit circular cross sections with diameters D50. The diameters D50 may be, for instance, in the range from 20 μm to 200 μm, or in the range from 20 μm to 100 μm.

Figure 12A:
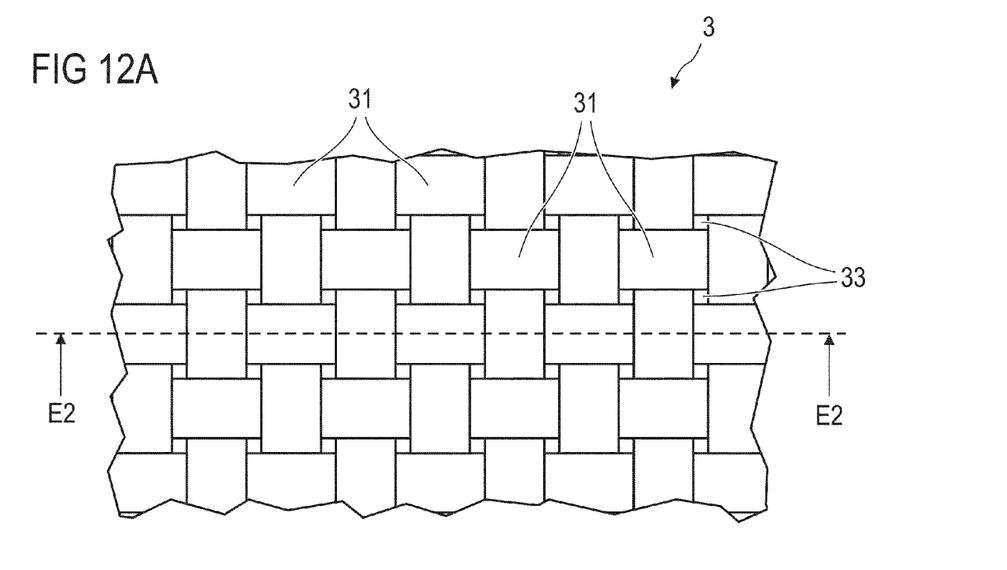
FIG. 12A is a top view of an insert according to FIG. 11A, wherein the wires are formed as flat metal ribbons.
Figure 12B:
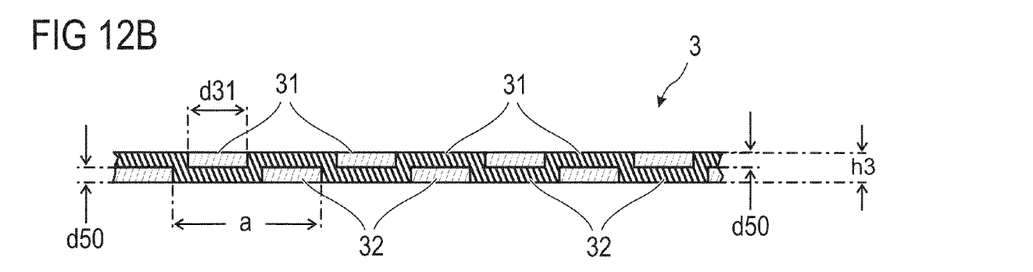
FIG. 12B is a vertical section of the insert shown in FIG. 12A in a sectional plane E2.

As an alternative to circular cross sections, other cross sections are also applicable. For instance, the wires 50 shown in FIG. 12A and the corresponding sectional view of FIG. 12B in a sectional plane E2 exhibit rectangular cross sections with thicknesses d50. However, wires 50 with any other cross section such as elliptical cross sections may also be used.

Figure 13:
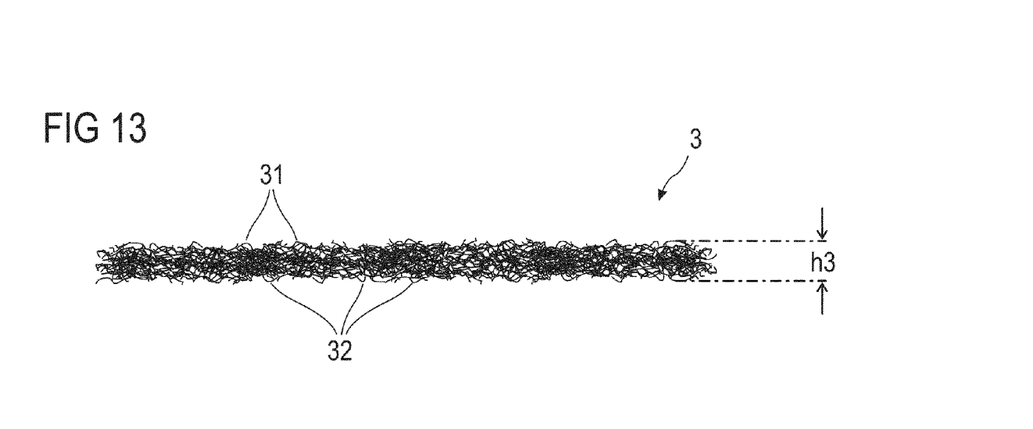
FIG. 13 is a vertical section of an insert formed as flat mat from fibers catched in one another.

An other example of an insert 3 which is formed as a flat mat from fibers catched in one another is shown in FIG. 13. The insert 3 is composed of or comprises a number of fibers irregularly arranged relative to one another.

Referring now to FIGS. 14A to 14D there is illustrated a method for producing a solder bond between an insulating substrate 2 and a base 1, for example a metallic baseplate for a power semiconductor module using an insert 3 initially independent of the insulating substrate 2. In this arrangement the insert 3 is positioned between the bottom side metallization layer 21 of the insulating substrate 2 and the metal surface 1t of the base 1, after a solder 4 being disposed between the insert 3 and the metal surface 1t. The solder 4 can be applied, for example, as a preform solder in an overall thickness D4 ranging from 50 μm to 500 μm or from 50 μm to 300 μm to the metal surface it and/or to the bottom side of the insert 3 facing the metal surface 1t, or it can top the metal surface it as a prefabricated solder pad.

Figure 14A:
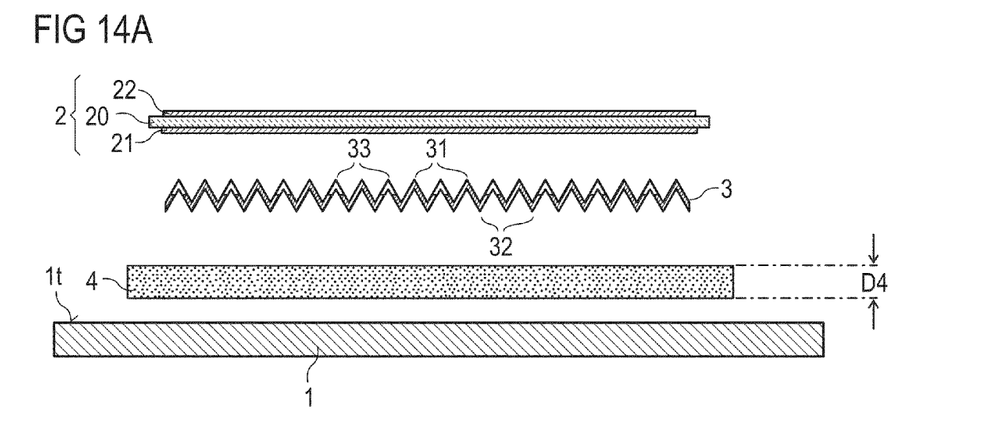
FIG. 14A is a vertical section through a ceramic substrate prior to being soldered to a metal base with an insert and a solder arranged between the substrate and the metal base.

Instead of a preform solder 4 a solder paste may also be used. Such solder paste may be applied, for instance, to the top side 1t of the base 1.

Generally, the total thickness D4 of the used solder 4 is a function of the required solder volume as needed to pack the interstices in the insert 3. In soldering the insulating substrate 2 and insert 3 to the metal surface 1t of the base 1 the solder embeds the insert 3 and completely fills all interstices between the bottom side metallization layer 21, the metal surface 1t, and the insert 3. That is, after completing the soldering process there are no interstices filled with gas. As already explained above, openings 33 facilitate the propagation of the liquid solder 4 on both sides of the insert 3.

If an insert 3 without openings 33 is used, the solder 4 is either required to flow around the outer edges of the insert 3, or solder 4 is provided on both sides of the insert 3, that is both between the insert 3 and the bottom side metallization layer 21 and between the insert 3 and the base 1.

Figure 14B:
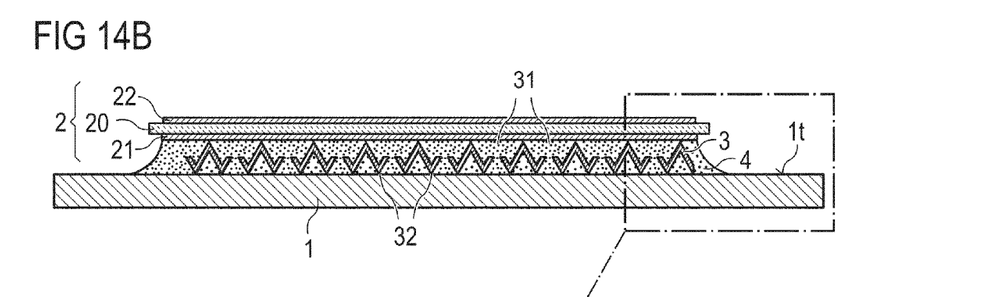
FIG. 14B is a vertical section of the components shown in FIG. 14A after soldering the ceramic substrate to the metal base.

Generally, the amount of the applied solder 4, for instance the thickness of the solder pad, is scaled so that after completing the soldering process all interstices are completely filled the solder 4. During soldering during which the solder 4 is rendered molten, the insulating substrate 2, the insert 3, the solder 4 and the base 1 are each compressed against the other. It is the molten solder 4 which is urged into the thin gaps between the wave crests 31 and the bottom side metallization layer 21 and into the thin gaps between the wave troughs 32 and the base 1 (where such gaps at all exist). Subsequently, the solder 4 is cooled down below its melting point. Once the solder 4 has solidified it forms together with the insulating substrate 2, insert 3 and base 1 a solid composite as shown in FIG. 14B which is immune to changes in temperature. As can be seen from FIG. 14B, there are sections of the solder 4 extending continuously from the bottom side metallization layer 21 through an opening 33 (see FIG. 14A) to the base 1. Due to the insert 3, the growth of cracks in solder 4 during the operation of such an arrangement is blocked.

In order to relieve strain, the insert 3 may be annealed, for instance at temperatures above 350° C., prior to the soldering process.

Figure 14C:
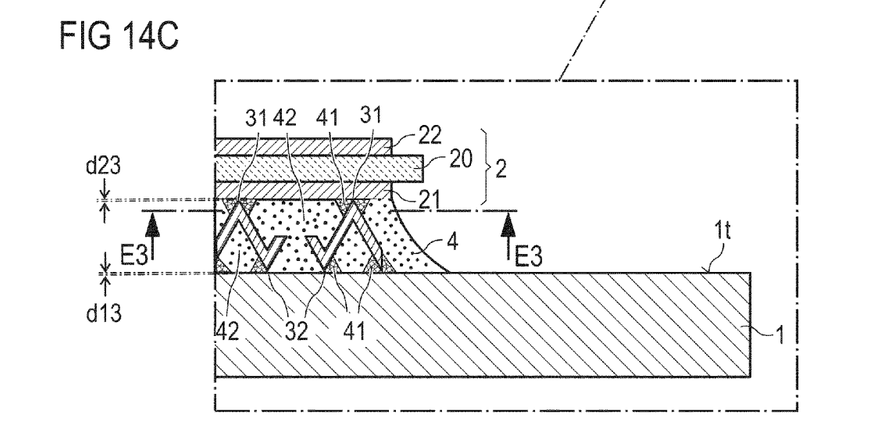
FIG. 14C is an enlarged detail of the arrangement shown in FIG. 14B.

Referring now to FIG. 14C which shows an enlarged detail of the composite shown in FIG. 14B, the solder 4 comprises first regions 41 and second regions 42. Each first region 41 extends continuously either between the wave crests 31 and the bottom side metallization layer 21, or between the wave troughs 32 and the base 1. In the first regions 41, the solder 4 is, in the ideal case, only formed of one or more intermetallic phases. If, for instance, the solder 4 includes tin and at least one of the bottom side metallization layer 21 and the insert 3 includes copper, during the soldering process copper-tin intermetallic phases (e.g. $Cu_3Sn$, $Cu_6Sn_5$) can develop if enough copper (which is included in the bottom side metallization layer 21 and/or in the insert 3) diffuses into the liquid solder 4. In order to provide enough copper, an insert 3 is not necessarily required to include uniformly distributed copper. Instead, it is also possible to produce an insert 3 by applying a copper or copper-containing coating to body including no or little copper only. The thickness of such coating may be, for instance, in the range from 2 μm to 10 μm.

The intermetallic phases exhibit a mechanical strength which is higher than the mechanical strength the solder 4 has prior to the soldering process and higher than the mechanical strength the solder 4 has in the second regions 42 after completing the soldering process. The formation of the regions 42 takes place if not enough copper could diffuse into the fluid solder 4. The progress of the diffusion depends on the temperature and the soldering time. Therefore, so as to achieve first regions 41 subject to the secondary condition of keeping the soldering temperatures low and the soldering time short, it is favourable if the distance d23 between the bottom side metallization layer 21 and the insert 3 (i.e. between the bottom side metallization layer 21 and the wave crests 31) and the distance d13 between the base 1 and the insert 3 (i.e. between the base 1 and the wave troughs 32) are short. For instance, the each of the distance d13 and d23 may be less than 20 µm. In the sense of the present invention, a region of the solder 4 is regarded as first region 41 if it comprises at least 90 vol % of one ore more intermetallic phases. For example, the distance d23 between each of the wave crests 31 and the bottom side metallization layer may be less than or equal to 30 µm, for instance in the range from 2 µm to 30 µm, and the distance d31 between each of the wave troughs 32 and the base 1 may be less than or equal to 30 µm, for instance in the range from 2 µm to 30 µm. It shall be pointed out that intermetallic phases also occur close to the surfaces of the bottom side metallization layer 21, the base 1 and the insert 3 which comprise copper and which are in contact with fluid solder 4. In general, the formation of second regions 42 can be avoided if the soldering time is long enough.

The soldering temperature may be in the range from 240° C. to 400° C., an for instance be greater than or equal to 330° C. so as to facilitate the formation of intermetallic phases.

Figure 14D:
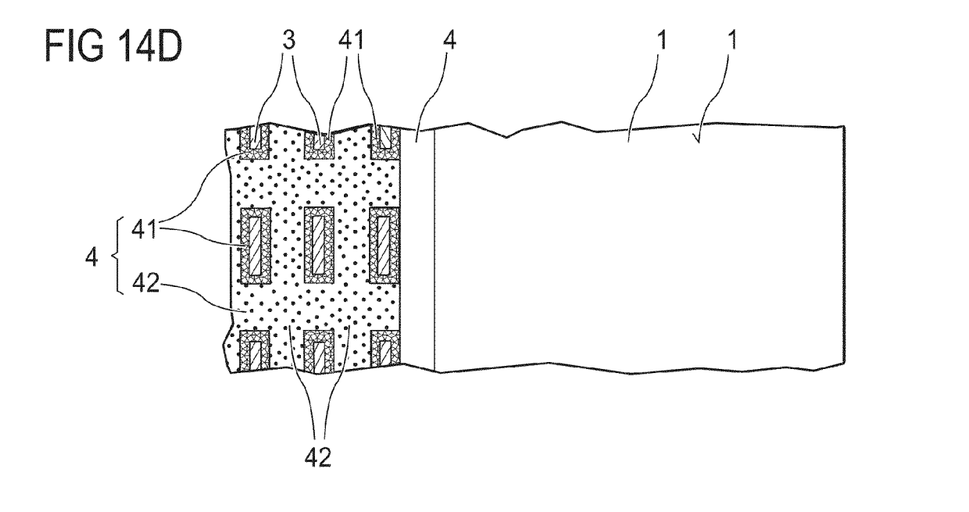
FIG. 14D is a sectional view of the arrangement shown in FIG. 14C in a sectional plane E3.
Figure 14E:
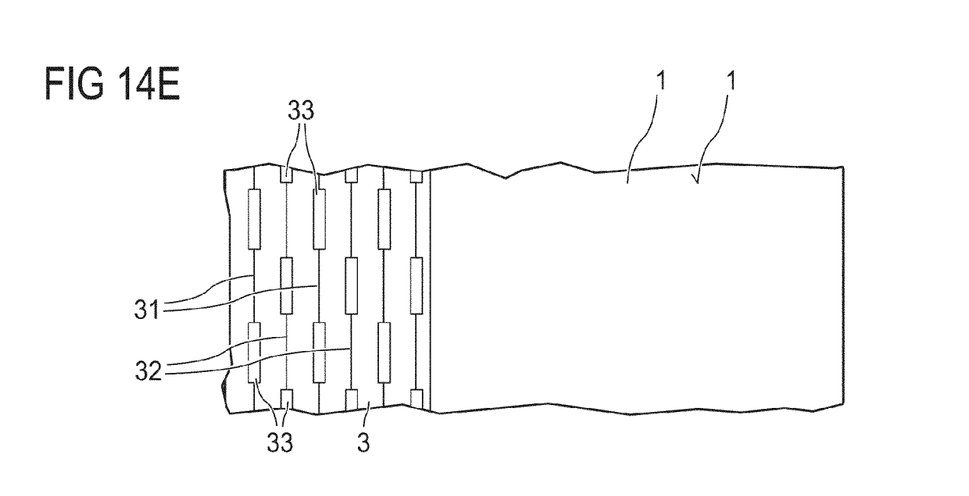
FIG. 14E is a top view of the arrangement of FIG. 14B with the substrate and the solder removed.

As an additional advantage, the melting point of the intermetallic phases, i.e. the melting point of the solder 4 in the first regions 41, is higher than the melting point of the solder 4 prior to the soldering process and higher than the melting point of the solder 4 in the second regions 42 as well. For example, if the first regions 41 are formed of copper-tin intermetallic phases only, the melting point of the solder 4 in the first regions 41 is at least 415° C. which is the melting point of Cu6Sn5. Therefore, the existence of first regions 41 allows for an operation of a semiconductor module at comparatively high temperatures. In comparison, in the second region(s) 42 the solder 4 exhibits a melting point which is significantly lower than the melting point of the solder 4 in the first regions. For example, the melting point in the second regions 42 may be less than 300° C. FIG. 14D is a sectional view of the arrangement shown in FIG. 14C in a sectional plane E3, FIG. 14E a top view of the arrangement of FIG. 14B with the substrate 2 and the solder 4 removed.

Then, the solder close to the base 1 may include a solder deposit which serves for compensating tolerances. The deposit may be pre-soldered by electroplating and may exhibit a thickness in the range from 5 µm to 30 µm.

Figure 15:
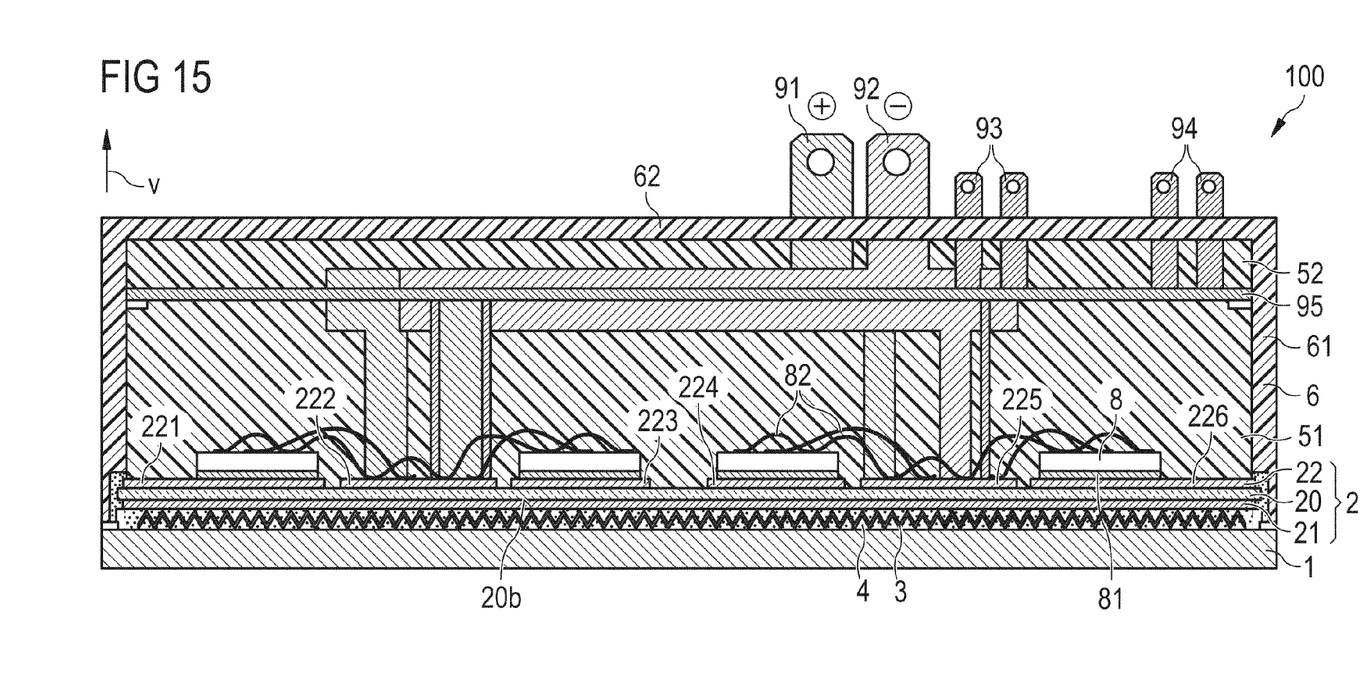
FIG. 15 is a vertical section through a power semiconductor module.

Referring now to FIG. 15 there is illustrated a vertical cross-sectional view of a power semiconductor module 100, which, as described above, comprises an insulating substrate 2 whose bottom side metallization layer 21 is soldered to a base 1 using a solder 4 and an insert 3. The module 100 further comprises a housing 6 with an electrically insulating frame 61 on all sides as well as an optional housing cover 62. The base 1 is configured as a metal base plate, representing the bottom housing wall of the module 100. The baseplate may range from 0.1 mm to 20 mm thick.

Mounted on the top side metallization layer 22 of the insulating substrate 2 are several power semiconductor chips 8 connected to the insulating substrate 2 by a bonding layer 81, for example of solder, an electrically conductive adhesive or a silver pressure sintered bond. The power semiconductor chips 8 may be, for example, controllable power semiconductor switches such as, for example, MOSFETs, IGBTs, thyristors, JFETs or power diodes. The power semiconductor chips 8 are semiconductor chips featuring high nominal currents exceeding 50 A or 75 A and/or high nominal blocking voltages exceeding 400 V, for example. In addition, the footprint of the power semiconductor chips may be sized to exceed 5.5 by 5.5 mm or 7 by 7 mm.

The power semiconductor chips 8 are topped by the electric circuitry thereof with portions of the top side metallization layer 22 by means of bond wires 82. Instead of bond wires 82 metal clips may also be provided, for example, electrically conductively connected to the top of the chips 8 and/or the top side metallization layer 22 by soldering, by electrically conductive adhesive bonding or silver pressure sintered bonding.

To connect the power semiconductor module 100 externally to, for example, a power supply, a load, a controller, etc, electric terminals 91, 92, 93, 94 are provided, the electric terminals 91, 92 of which may be configured, for example, to make the power supply connection and electrically and/or mechanical bonded to the portions 221, 222, 223, 224, 225, 226 of the top side metallization layer 22. Power supply terminals may also be positioned in the frame of the housing wire-bonded to the top side metallization layer 22. The terminals 93, 94 may be configured as control terminals, for instance, for one or more of the power semiconductor chips 8 or as output terminals for outputting signals presenting information as to the status of the power semiconductor module 100.

The power semiconductor chip 8 is topped by an optional printed circuit board (PCB) 95 for circuiting internal driver terminals. The PCB 95 may also be componented with electronics to control the controllable chips of the power semiconductor chips 8. Power semiconductor modules sophisticated with control electronics are also termed "intelligent" (IPMs).

To boost the dielectric strength the bottom of the base 1 is potted with an optional potting compound 51, for instance a silicon gel extending, for example, in a vertical direction v from the insulating substrate 2 at least beyond the power semiconductor chip 8 or the bond wires 82, for instance, as far as the printed circuit board 95. The potting compound 51 is topped by an optional rigid potting compound 52, for example an epoxy resin, to electrically insulate the electric terminals 91, 92, 93, 94 and the 92 for added mechanical stability. Thereby, the vertical direction v is the direction perpendicular to the insulation carrier 20, that is, the vertical direction v is the surface normal of the top side of the insulation carrier 20, i.e. its side facing towards the at least one power semiconductor chip 8.

Referring still to FIG. 15 there is illustrated how the insert 3 may cover the bottom side metallization layer 21 of the insulating substrate 2 in its entirety. In general, any other assembly—for example, any of the assemblies as explained by way of example with reference by the previous FIGS. 1 to 15—can come into consideration for the geometry of the insert 3.

To fabricate the power semiconductor module 100 the power semiconductor chips 8 can be solidly bonded to the top side metallization layer 22 before the metal surface It is soldered to the bottom side metallization layer 21 and to the insert 3. The composite formed by soldering the metal surface It to the bottom side metallization layer 21 and insert 3 can then be furnished with the electric terminals 91, 92, 93, 94 and the proper electric functioning of the resulting module tested. When tested positive the module can be inserted in the frame 61 or the module housing 6 in its entirety and then potted with the potting compounds 51 and 52. It is an advantage when this module is provided with electric terminals before being inserted in the frame 61 or module housing 6 to then test the resulting module for proper electric functioning. If the module test should be negative the module can be replaced, before being installed in the module housing 6, by a proper functioning module.

The operating temperature of the base 1 and the substrates 2 in a semiconductor module 100 may be between 60° C. and 100° C., while the storage temperature may typically lie between −40° C. and +125° C. or between −40° C. and 150° C.

Figure 16:
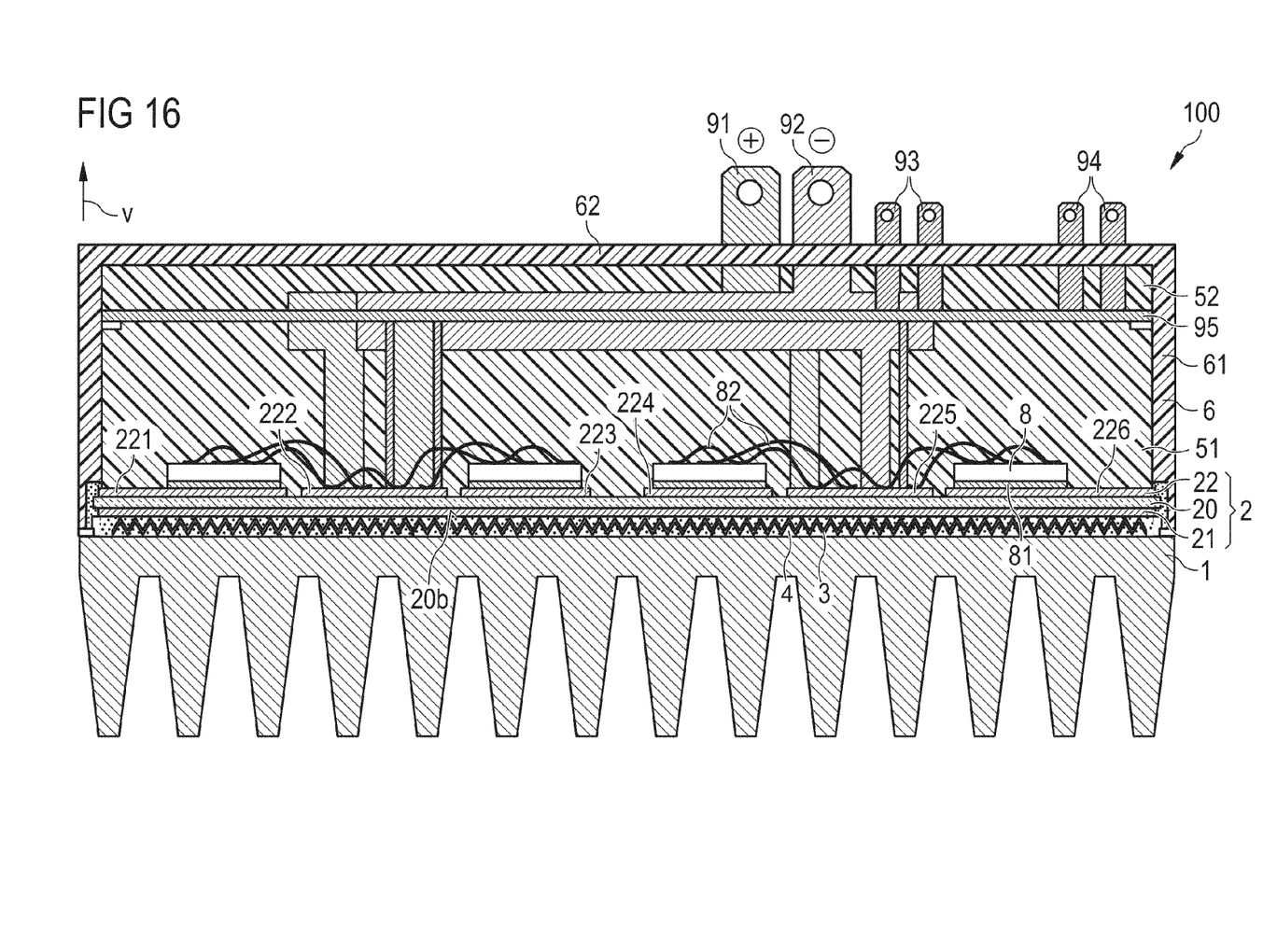
FIG. 16 is a vertical section through a power semiconductor module with a base which is designed as a heat sink.

Referring now to FIG. 16 there is illustrated a further example for a possible semiconductor module 100. This module 100 exhibits the same features as the module of FIG. 15 with the sole difference, that the base 1 is formed as a heat sink with cooling fins on its side facing away from the substrate 2.

Even though in the examples of FIGS. 15 and 16 there is only one substrate 2 soldered to the base 1 by means of a solder 4 in combination with an insert 3, in alternative modules 100 also two or more substrates 2 may be soldered to a common base 1 in the same way as described with reference to the previous figures.

Figure 17:
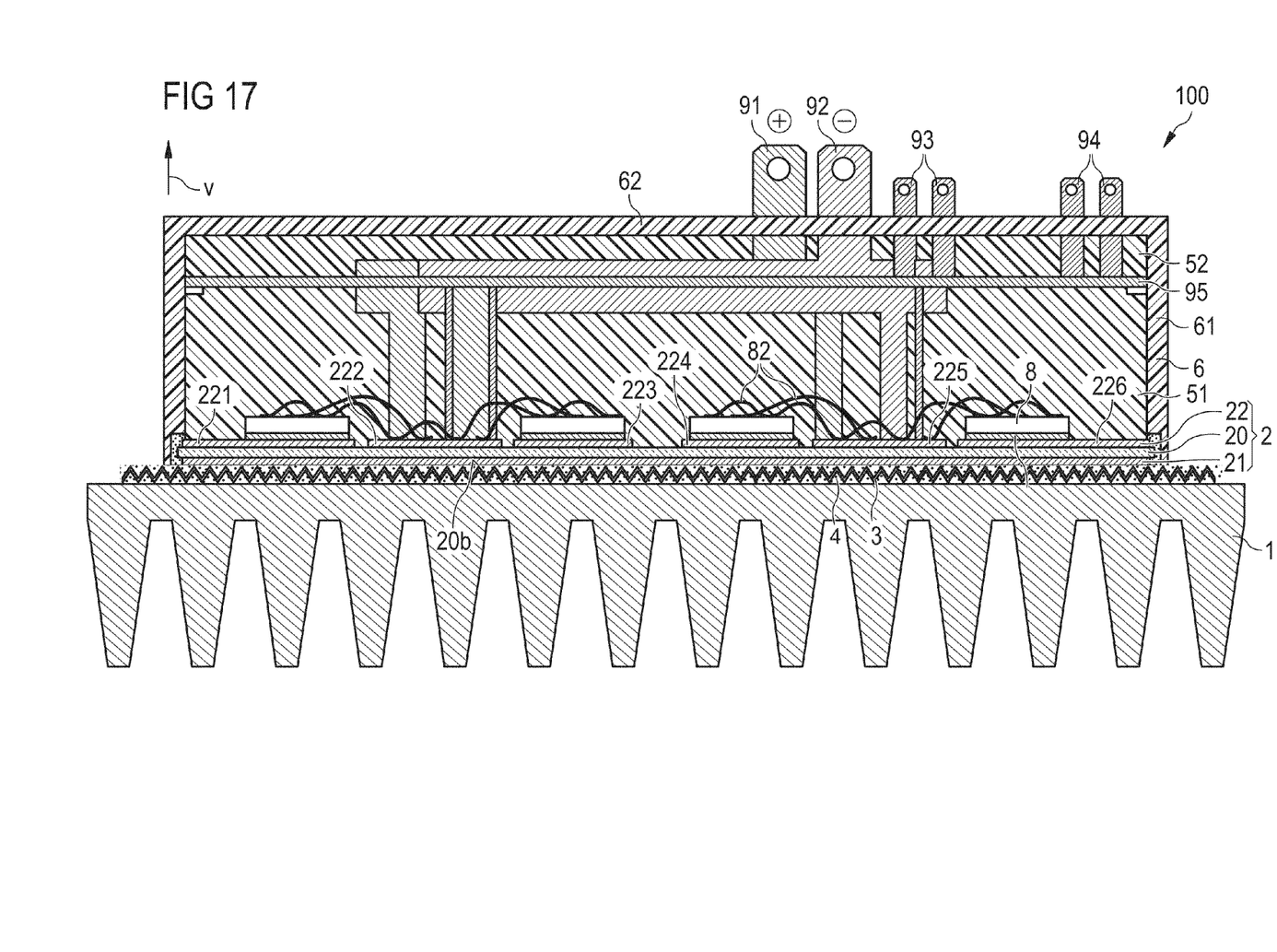
FIG. 17 is a vertical section through a power semiconductor module in which the insert projects beyond the substrate.

Referring now to FIG. 17 there is exemplary illustrated that an insert 3 may also protrude beyond the substrate 2 laterally. In particular, an insert 3 may protrude beyond the substrate 2 in any lateral direction which is perpendicular to the vertical direction v. In case of more than one substrates 2 soldered to the same base 1, an insert 3 may protrude in a or in any lateral direction beyond any of these substrates 2, or, alternatively, beyond a subset of these substrates 2.

In a semiconductor module 100, an insert 3 may also be selectively placed on the edge of a substrate 2 or under active chip areas. The selective arrangement underneath an active chip area improves the heat dissipation of the active area.

In general, any insert 3 used in the present invention, in particular the inserts 3 described by way of example with reference to the drawings 1 to 17, may exhibit the following features:

The waves of an insert 3 may be periodic or aperiodic. In case of a periodic structure, the period a of the waves may be, for instance, in the range from 100 µm to 2 mm, or from 300 µm to 1 mm (see FIGS. 4 to 7, 8A, 8B, 9B, 10B, 11B and 12B).

An insert 3 may consist of or include one or more of: Cu, Fe, Ni, bronze or brass.

The height h3 of the insert may be, for instance, at least 100 µm, for example in the range from 100 µm to 1 mm (see FIGS. 4, 5, 6, 7, 8B, 9B, 10B, 11B, 12B, 13)

The distance d31 between two adjacent ones of the wave crests 31 may be greater than or equal to 100 µm, or greater than or equal to 300 µm.

Further, the distance d31 may be less than or equal to 2 mm, or less than or equal to 1 mm.

An insert 3 may comprise copper, or consist of copper, or comprise an alloy with copper and tin, or consists of an alloy of copper and tin.

The material of the base 1 may be, inter alia, copper or aluminum or a metal matrix material (MMC) such as AlSiC or CuMo or MoAlNi, or AlC. In case of aluminum, the base 1 may be plated with a metal, e.g. copper, that supports, in together with one or more components of the used solder, the formation of intermetallic phases.

The surfaces of the bottom side metallization layer 21 and/or the top side metallization layer 22 and/or the base 1 and/or the insert 3 may be coated, e.g. by electroplating, sputtering or vapour deposition, with other metals like Ni, Ag, Au, Cu to facilitate the soldering or to improve phase formation. The thickness of such coatings may range from 100 nm to 20 µm.

Solders 4 like SnSb5, SnAg3.5, SnAg3.5Cu0.5, SnAg3.5Cu0.7, SnAg20, J, K, L-alloys, or $Sn_xAg_y$, $Sn_xCu_y$, where $x+y=1$, or $Sn_xAg_yCu_z$ where $x+y+z=1$ may comprise a significant amount of tin so as to enable the formation of copper tin intermetallic phases during the soldering process.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module comprising:
    a rigid base;
    an insulating substrate comprising an insulation carrier featuring a top side provided with a top side metallization layer, and a bottom side provided with a bottom side metallization layer;
    a power semiconductor chip arranged on the top side metallization layer;
    a stamped or embossed metal sheet insert arranged between the base and the bottom side metallization layer and comprising a wavy shape with a plurality of wave crests and a plurality of wave troughs, the wave crests facing towards the bottom side metallization layer and the wave troughs facing towards the base;
    a solder arranged between the bottom side metallization layer and the base, the solder completely filling all interstices between the bottom side metallization layer and the base;
    wherein the solder comprises first solder regions having a first melting point and a second solder region having a second melting point that is different than the first melting point.

2. The semiconductor module as set forth in claim 1 wherein each of the first solder regions
    comprises at least 90 vol % of one or more copper-tin intermetallic phases; and
    extends continuously either between the bottom side metallization layer and one of the wave crests, or between the base and one of the wave troughs.

3. The semiconductor module as set forth in claim 2 wherein the second solder region is arranged outside the first solder regions and the second melting point is lower than the melting point of the Cu6Sn5 copper-tin intermetallic phase.

4. The semiconductor module as set forth in claim 3 wherein the second melting point is less than 300° C.

5. The semiconductor module as set forth in claim 1 wherein the distance between each of the wave crests and the bottom side metallization layer is less than 20 μm.

6. The semiconductor module as set forth in claim 1 wherein the distance between each of the wave troughs and the base is less than 20 μm.

7. The semiconductor module as set forth in claim 1 wherein the distance between two adjacent ones of the wave crests is greater than or equal to 100 μm, or greater than or equal to 300 μm.

8. The semiconductor module as set forth in claim 1 wherein the distance between two adjacent ones of the wave crests is less than or equal to 2 mm, or less than or equal to 1 mm.

9. The semiconductor module as set forth in claim 1 wherein the wavy insert
comprises copper; or
consists of copper; or
comprises an alloy with copper and tin; or
consists of an alloy of copper and tin.

10. The semiconductor module as set forth in claim 1 wherein the metal sheet is a bent and/or pressed and/or embossed metal foil.

11. The semiconductor module as set forth in claim 10 wherein the thickness of the foil is in the range from 20 μm to 200 μm, or in the range from 20 μm to 100 μm.

12. The semiconductor module as set forth in claim 1 wherein the wavy insert comprises a plurality of openings, and wherein the solder extends continuously from the bottom side metallization layer through each of the openings as far as to the base.

13. The semiconductor module as set forth in claim 1 wherein base is a plate exhibiting a thickness in the range from 0.1 mm to 20 mm, or a heat sink.

14. The semiconductor module as set forth in claim 1 wherein the insert protrudes the
insulation carrier in a direction perpendicular to the surface normal of the top side of the insulation carrier.

* * * * *